United States Patent
Kang et al.

(10) Patent No.: US 8,002,600 B2
(45) Date of Patent: Aug. 23, 2011

(54) METHOD FOR REPAIRING DEFECTIVE LINE OF ORGANIC LIGHT EMITTING DISPLAY DEVICE

(75) Inventors: Jin-Gyu Kang, Yongin (KR); Keun Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 130 days.

(21) Appl. No.: 12/488,019

(22) Filed: Jun. 19, 2009

(65) Prior Publication Data
US 2010/0015876 A1    Jan. 21, 2010

(30) Foreign Application Priority Data
Jul. 21, 2008  (KR) .................. 10-2008-0070609

(51) Int. Cl.
*H01J 9/50* (2006.01)
(52) U.S. Cl. ............... 445/2; 313/504; 349/141; 438/15
(58) Field of Classification Search ...... 445/2; 313/504, 313/517; 257/40; 349/141; 438/15
See application file for complete search history.

(56) References Cited

U.S. PATENT DOCUMENTS

| | | | |
|---|---|---|---|
| 7,258,586 B2 * | 8/2007 | Tamura et al. | 445/24 |
| 2004/0096993 A1 * | 5/2004 | Kuo | 438/15 |
| 2005/0094081 A1 * | 5/2005 | Lee | 349/141 |
| 2006/0290277 A1 * | 12/2006 | Takahashi et al. | 313/517 |
| 2007/0114918 A1 * | 5/2007 | Arai et al. | 313/504 |
| 2009/0061720 A1 * | 3/2009 | Fujimaki | 445/2 |

FOREIGN PATENT DOCUMENTS

| | | |
|---|---|---|
| JP | 2004-342457 | 12/2004 |
| KR | 2000-4398 | 1/2000 |
| KR | 2001-100378 | 11/2001 |
| KR | 2006-119133 | 11/2006 |

* cited by examiner

*Primary Examiner* — Nimeshkumar Patel
*Assistant Examiner* — Mary Ellen Bowman
(74) *Attorney, Agent, or Firm* — H.C. Park & Associates, PLC

(57) ABSTRACT

A method of repairing a defective line of an organic light emitting display device which repairs a short defect occurring between a bidirectional line and an adjacent line includes separating a portion where a short defect occurs from the bidirectional line by cutting a portion of the bidirectional line; and applying a signal toward an end of the cut portion from both sides of the bidirectional line.

19 Claims, 4 Drawing Sheets

METHOD FOR REPAIRING DEFECTIVE LINE OF ORGANIC LIGHT EMITTING DISPLAY DEVICE

CROSS-REFERENCE TO RELATED APPLICATIONS

This application claims the benefit of Korean Patent Application No. 10-2008-0070609, filed on Jul. 21, 2008, in the Korean Intellectual Property Office, the disclosure of which is incorporated herein by reference.

BACKGROUND OF THE INVENTION

1. Field of the Invention

Aspects of the present invention relate to a method of repairing a defective line of an organic light emitting display device, and more particularly, to a method of repairing a defective line of an organic light emitting display device to repair short defects between lines.

2. Description of the Related Art

An organic light emitting display device, which is a kind of a flat panel display device displaying an image by using an organic light emitting diode, has excellent luminance and color purity. As a result, the organic light emitting display device is drawing attention as a next-generation display device.

The organic light emitting display device is driven by being supplied with scan signals, data signals, etc., as well as first and second pixel power sources ELVDD and ELVSS. Also, in an active matrix type organic light emitting display device, each pixel includes a plurality transistors and capacitors. Further, the active matrix type organic light emitting display device is driven by being supplied with initialization power, etc., according to a pixel structure.

Accordingly, the organic light emitting display device has a complicated line structure as compared to other flat panel display devices, such as a liquid crystal display device, a plasma display panel, etc.

Because of the complicated line structure, when a short defect occurs between the lines of the organic light emitting display device, a sufficient space for repairing the line defect may not be available, such that it may be difficult to repair the line defect.

SUMMARY OF THE INVENTION

Therefore, aspects of the present invention provide a method of easily repairing a short defect between lines of an organic light emitting display device.

According to an embodiment of the present invention, there is provided a method of repairing a defective line of an organic light emitting display device which repairs a short defect occurring between a bidirectional line and an adjacent line, the method comprising: separating a portion where a short defect occurs from the bidirectional line by cutting a portion of the bidirectional line; and applying a signal toward an end of the cut portion from both sides of the bidirectional line.

According to an aspect of the present invention, the bidirectional line may be cut in an area where the bidirectional line is not overlapped with a lower line.

Also, according to an aspect of the present invention, the bidirectional line may be cut using a laser.

Also, according to an aspect of the present invention, the bidirectional line may be established as a first power supply line or a data line.

Also, according to an aspect of the present invention, when the adjacent line is established as the bidirectional line, one of two lines where the short defect occurs may be cut selectively.

According to an embodiment of the present invention, there is provided a method of repairing a short defect between a bidirectional line and an adjacent line of an organic light emitting display device, the method comprising: cutting the bidirectional line to create cuts that separate a portion of the bidirectional line where the short defect occurs from remaining portions of the bidirectional line and such that the remaining portions of the bidirectional line each function as a unidirectional line to provide power or a signal in a direction toward the cuts.

According to an embodiment of the present invention, there is provided a method of repairing a short defect between two adjacent bidirectional lines of an organic light emitting display device, the method comprising: cutting at least one bidirectional line to create cuts that separate a portion of the at least one bidirectional line where the short defect occurs from remaining portions of the at least one bidirectional line and such that the remaining portions of the at least one bidirectional line each function as a unidirectional line to provide power or a signal in a direction toward the cuts.

According to aspects of the present invention, when the short defect between the bidirectional line and the adjacent line capable of being supplied with the signal from the two directions occurs, the bidirectional line having the short defect portion is cut by the laser, making it possible to easily repair the short defect, even when secure repair space is not available. Then, the signal is supplied from both sides of the bidirectional line where one area having the short defect is cut, such that the bidirectional line where the one area is disconnected can smoothly transfer the signal to the inside of the panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
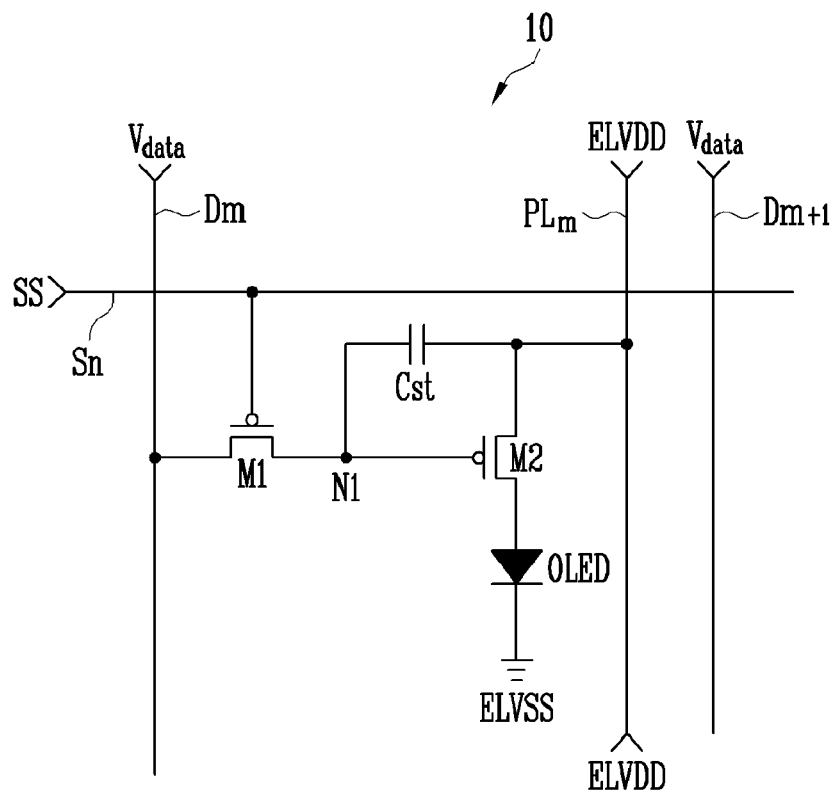
FIG. 1 is a circuit diagram showing a pixel of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a circuit diagram showing a pixel of an organic light emitting display device according to an embodiment of the present invention. Referring to FIG. 1, the pixel 10 of the organic light emitting display device includes first and second transistors M1 and M2, a storage capacitor Cst, and an organic light emitting diode (OLED).

The first transistor M1 is coupled between a data line Dm and a first node N1 and a gate electrode of the first transistor M1 is coupled to a scan line Sn. The first transistor M1 is turned on when it is supplied with a scan signal SS from the scan line Sn to supply data voltage Vdata supplied from the data line Dm to a first node N1.

The second transistor M2 is coupled between a first pixel power supply ELVDD and the OLED and a gate electrode of the second transistor M2 is coupled to the first node N1. The second transistor M2 controls a current amount supplied to the OLED corresponding to the voltage of the first node N1.

The storage capacitor Cst is coupled between the first node N1 and the first pixel power supply ELVDD. The storage capacitor Cst stores a difference voltage between the first pixel power supply ELVDD and the data voltage Vdata when the data voltage Vdata is supplied to the first node N1 and maintains the difference voltage for one frame.

The OLED is coupled between the second transistor M2 and a second pixel power supply ELVSS. The OLED emits light at luminance corresponding to the amount of a current supplied from the second transistor M2.

Hereinafter, a method of driving the aforementioned pixel 10 will be described. For convenience, the description does not consider the threshold voltage of the second transistor M2, etc.

First, when the low-level scan signal SS is supplied to the scan line Sn, the first transistor M1 is turned-on. As a result, the data voltage Vdata supplied from the data line Dm is supplied to the first node N1.

When the data voltage Vdata is supplied to the first node N1, the storage capacitor Cst stores voltage corresponding to the difference voltage ELVDD-Vdata between the first pixel power supply ELVDD and the data voltage Vdata Then, the second transistor M2 controls the current amount supplied to the OLED corresponding to voltage Vgs between the gate electrode and the source electrode maintained by the storage capacitor Cst. The OLED emits light at a luminance corresponding to the amount of the current supplied from the second transistor M2.

As can be appreciated from the example of the aforementioned pixel 10, in the case of the organic light emitting display device, the light emitting luminance of the pixel 10 can be determined according to the data voltage Vdata supplied through the data line Dm and the voltage value of the first pixel power supply ELVDD supplied through a first power supply line PLm.

Therefore, in order to display a uniform image, the data voltage Vdata and the first pixel power supply ELVDD should be uniformly supplied regardless of the position where the pixel 10 is arranged.

However, when the OLED is light emitted, a current path from the first pixel power supply ELVDD to the second pixel power supply ELVSS via the second transistor M2 and the OLED is formed, thereby leading to voltage drop IR Drop at the first power supply line PLm. The voltage drop IR drop is larger as the distance through the first power supply line PLm is increased, such that each pixel may be supplied with a different magnitude of the first pixel power ELVDD according to the position of the pixel. In particular, as organic light emitting display devices become larger and larger, image quality can be uneven due to a luminance deviation according to the voltage drop of the first pixel power supply ELVDD.

Therefore, the organic light emitting display device is designed so that the first pixel power ELVDD is supplied from both ends of the first power supply line PLm, making it possible to mitigate the voltage drop IR Drop of the first pixel power supply ELVDD.

In other words, unlike a liquid crystal display device, etc., the organic light emitting display device may include a bidirectional line supplied with a signal (or power) from two directions. Both ends of the bidirectional line are coupled to a pad or a driving circuit, respectively, to be simultaneously supplied with the signal (or power) from two directions.

However, the organic light emitting display device has a disadvantage in having a relatively complicated line structure and densely arranged lines, such that a short defect can occur between lines that are positioned at the same layer.

For example, a short defect may occur between the first power supply line PLm of an $m^{th}$ column pixel 10 and a data line Dm+1 of an $m+1^{th}$ column pixel (not shown). In this case, however, sufficient space for forming a connection line, etc. may not be available, such that it may be difficult to repair the defective line.

Therefore, aspects of the present invention provide methods of repairing a short defect occurring between the adjacent lines as described below. In particular, when at least one line of the lines where the short defect occurs is designed as the bidirectional line, aspects of the present invention provide a method of easily repairing the short defect between the lines.

Figure 2A:
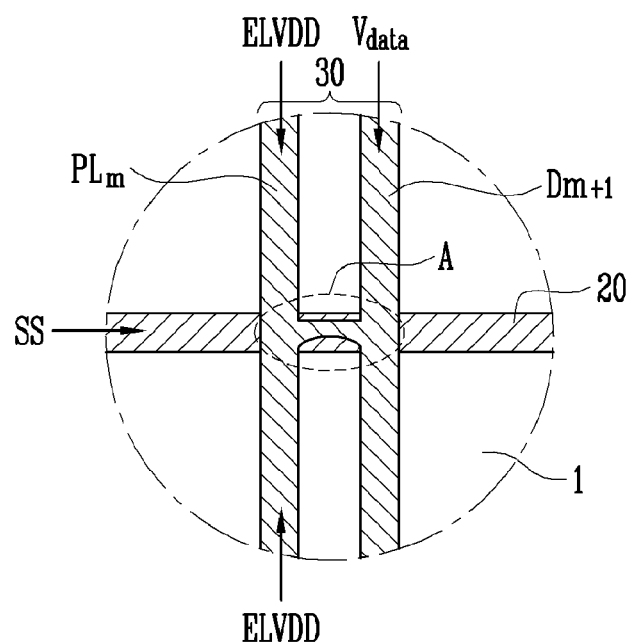
FIGS. 2A and 2B are plan views sequentially showing a method of repairing a defective line of an organic light emitting display device according to an embodiment of the present invention.
Figure 2B:
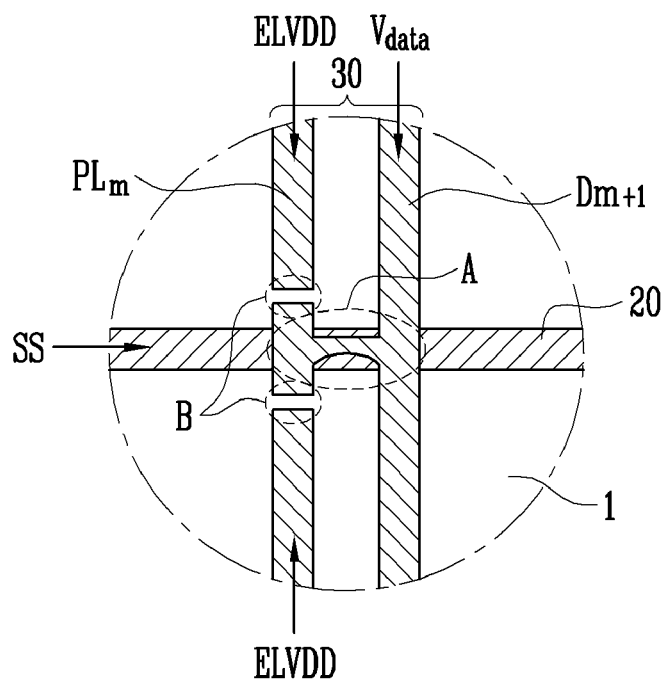

FIGS. 2A and 2B are plan views sequentially showing a method of repairing a defective line of an organic light emitting display device according to one embodiment of the present invention.

Referring to FIGS. 2A and 2B, a case where the power supply line PLm supplied with the first pixel power ELVDD is a bidirectional line and the short defect occurs between the first power supply line PLm and the adjacent data line Dm+1 will be described. For convenience, FIGS. 2A and 2B do not show components that are unnecessary for describing the present embodiments.

Referring to FIG. 2A, a lower line 20 is formed on a substrate of the organic light emitting display device in a first direction (horizontal direction) and upper lines 30 are formed in a second direction (vertical direction) intersecting the first direction. As used herein, the terms "lower line" and "upper line" refer to the location of the lines with respect to the substrate on which the lines are formed. In particular, the term "lower line" refers to a line that is closer to the substrate, and the term "upper line" refers to a line that farther away from the substrate. Typically, a lower line is a line that is formed earlier and an upper line is a line that is formed subsequently in the formation of an organic light emitting display device.

For example, the lower line 20 can be established as a gate line, such as a scan line formed of a gate metal and the upper lines 30 can be established as the first power supply line PLm formed of a source/drain metal and a source/drain line such as the data line Dm+1, etc.

An insulation layer (not shown) is interposed between the lower line 20 and the upper lines 30 to insulate the lines from each other.

The first power supply line PLm is supplied with the first pixel power ELVDD from two directions and the data line Dm+1 adjacent to the first power supply line PLm is supplied with the data voltage Vdata in a single direction. In FIG. 2A, the arrows indicate the application direction of the signals.

When the short defect occurs in an area between the first power supply line PLm and the data line Dm+1 (depicted as area A in FIGS. 2A and 2B), the first power supply line PLm is cut at respective sides (areas B) of the portion (area A) where the short defect occurs, thereby separating the portion (A area) where the short defect occurs from the first power supply line PLm.

The first pixel power ELVDD is applied to the end cut from both sides of the first power supply line PLm. The cut area of the first power supply line PLm may be established within a predetermined range so that the first power supply line PLm can smoothly supply the first pixel power ELVDD to the components, that is, to the pixels inside the panel. To this end, the first power supply line PLm may be precisely cut using a finely controllable laser, etc. Therefore, although the first power supply line PLm is disconnected at the middle (that is, at the location where the short occurs), the first pixel power ELVDD is applied from both ends of the first power supply line PLm, making it possible to normally drive the pixels.

When the first power supply line PLm is designed to intersect with the lower line 20, the first power supply line PLm is cut at an area where is the PLm line does not overlap with the lower line 20, such that the stability of the lower line 20 is not affected by the repairing of the short defect.

Also, if resistance values are varied due to the cut of the first power supply line PLm to cause a problem in the driving of the pixels, the variance can be improved by controlling a width or a thickness of the first power supply line PLm, etc.

In other words, when the short defect occurs between the first power supply line PLm being the bidirectional line and an adjacent line, e.g., the data line Dm+1, then according to the present embodiment, the bidirectional line may be cut, which does not cause a driving problem even when one area is cut, thereby easily repairing the short defect regardless of the availability of repair space.

Figure 3A:
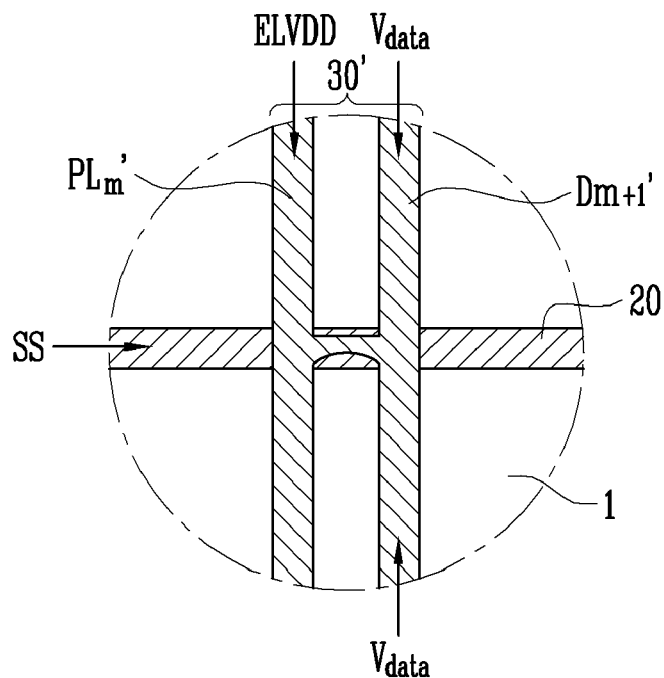
FIGS. 3A and 3B are plan views sequentially showing a method of repairing a defective line of an organic light emitting display device according to another embodiment of the present invention.
Figure 3B:
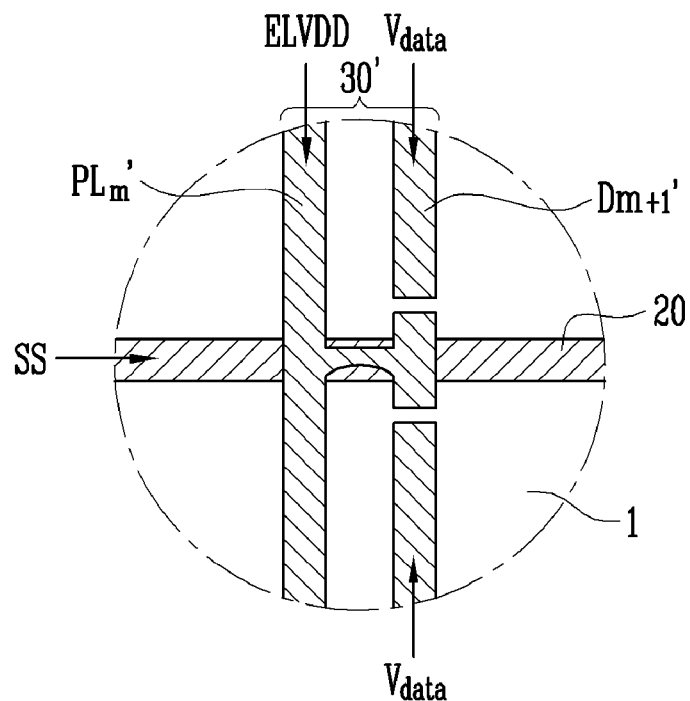

FIGS. 3A and 3B are plan views sequentially showing a method of repairing a defective line of an organic light emitting display device according to another embodiment of the present invention. For convenience in describing the embodiment according to FIGS. 3A and 3B, the detailed description of portions that are the same as those shown in FIGS. 2A and 2B will not be repeated.

Referring to FIGS. 3A and 3B, the first power supply line PLm' is a unidirectional line supplied with the first pixel power ELVDD from a single direction, and the data line Dm+1' adjacent to the first power supply line PLm' is a bidirectional line supplied with the data voltage Vdata from two directions.

When the data voltage Vdata is supplied from the two ends of the data line Dm+1', the data voltage Vdata can be charged into the pixels at high speed.

When a short defect occurs between the power supply line PLm' and the data line Dm+1', then according to another embodiment of the present invention, the data line Dm+1', which is the bidirectional line, is cut by a laser, etc., at an area where the line does not overlap with the lower line 20, thereby easily repairing the short defect.

Figure 4A:
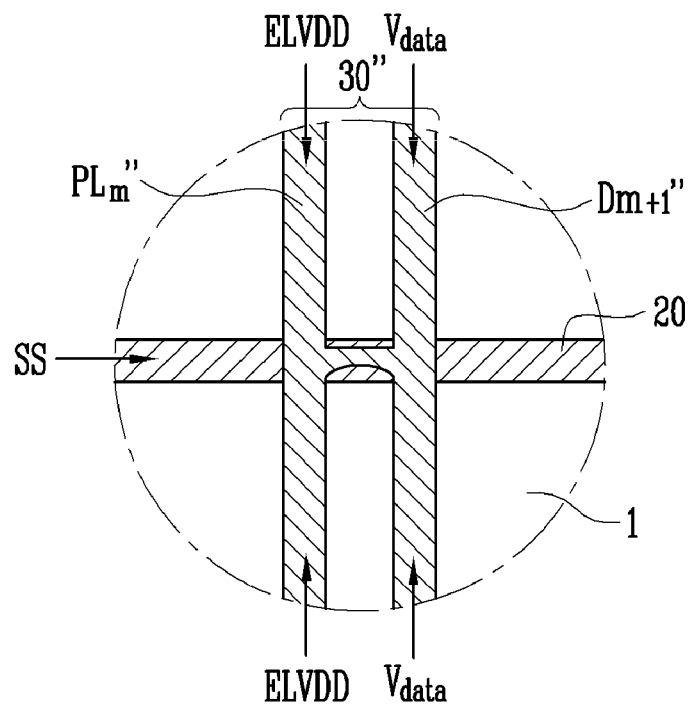
FIGS. 4A and 4B are plan views sequentially showing a method of repairing a defective line of an organic light emitting display device according to still another embodiment of the present invention.
Figure 4B:
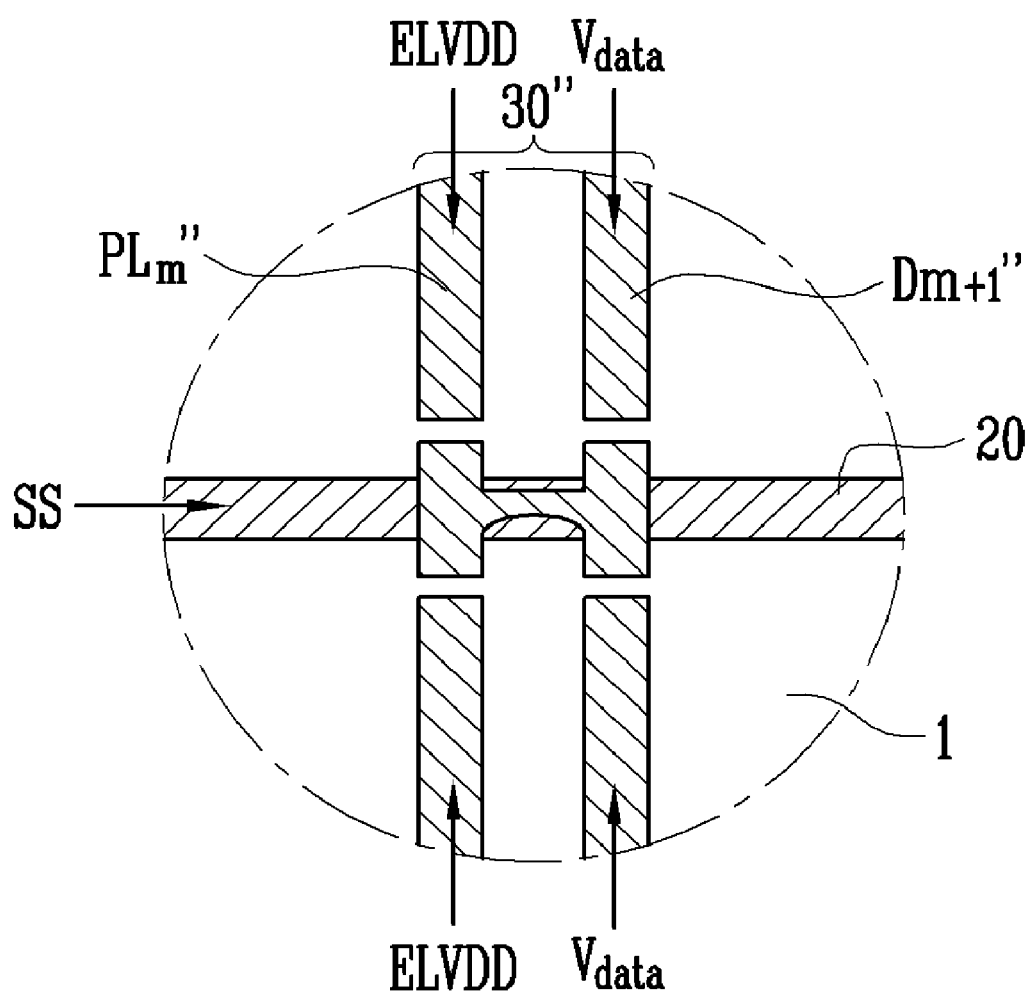

FIGS. 4A and 4B are plan views sequentially showing a method of repairing a defective line of an organic light emitting display device according to still another embodiment of the present invention. For convenience in describing the embodiment according to FIGS. 4A and 4B, the detailed description of portions that are the same as those shown in FIGS. 2A and 2B will not be repeated.

Referring to FIGS. 4A and 4B, both the first power line PLm" and the data line Dm+1", which are adjacent to each other, are bidirectional lines.

When both the first power line PLm" and the data line Dm+1" are bidirectional lines, the voltage deviation of the first pixel power ELVDD supplied to the pixels can be reduced and the data voltage Vdata can be charged at high speed.

When a short defect occurs between the power supply line PLm" and the data line Dm+1", then according to another embodiment of the present invention, either line may be selectively cut to repair the short defect or, as shown in FIG. 4B, both lines may be cut to repair the short defect.

Although the case where the first power supply line and/or the data line are established as the bidirectional line is described in the aforementioned embodiments by way of example, the present invention is not limited thereto.

For example, in order to solve a malfunction due to a delay of the scan signal and/or the light emitting control signal in the large organic light emitting display device, a scan driver is arranged at both sides of the pixel unit and the scan signal and the light emitting control signal can be supplied from two directions of the scan lines and/or the light emitting control lines, respectively.

In this case, when a short defect occurs in the adjacent scan lines and/or the light emitting control lines, any one of them is selectively cut, making it possible to repair the short defect.

In other words, according to aspects of the present invention, when a short defect occurs between a bidirectional line and an adjacent line, the bidirectional line is cut at an area where is the bidirectional line does not overlap with a lower line in order to separate the portion where the short defect occurs from the bidirectional line, and the signal (or power) may be applied toward the cut end from ends sides of the bidirectional line, making it possible to repair the short defect of the line.

Therefore, aspects of the present invention are usefully applicable when any one of the lines where the short defect occurs is the bidirectional line.

Also, even when the short defect occurs between lines that are established to be supplied with a signal in a single direction, if the design can be changed to supply the signal to at least one of the unidirectional lines in two directions, aspects of the present invention may be applied.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of repairing a defective line of an organic light emitting display device which repairs a short defect occurring in a bidirectional line shorted to an adjacent line, the method comprising:

separating a portion where a short defect occurs from the bidirectional line by cutting a portion of the bidirectional line; and applying a signal toward an end of the cut portion from both sides of the bidirectional line.

2. The method as claimed in claim 1, wherein the bidirectional line is cut in an area where the bidirectional line does not overlap with a lower line.

3. The method as claimed in claim 1, wherein the bidirectional line is cut using a laser.

4. The method as claimed in claim 1, wherein the bidirectional line comprises a first power supply line or a data line.

5. The method as claimed in claim 1, wherein if the adjacent line comprises a second bidirectional line, one of the adjacent line and the bidirectional line in which the short defect occurs is cut selectively.

6. A method of repairing a short defect in a bidirectional line shorted to an adjacent line of an organic light emitting display device, the method comprising:

cutting the bidirectional line to create cuts that separate a portion of the bidirectional line where the short defect occurs from remaining portions of the bidirectional line and such that the remaining portions of the bidirectional line each function as a unidirectional line to provide power or a signal in a direction toward the cuts.

7. The method of claim 6, wherein the bidirectional line is cut in an area where the bidirectional line does not overlap with a lower line.

8. The method of claim 6, wherein the bidirectional line is cut using a laser.

9. The method of claim 6, wherein the bidirectional line comprises a power supply line and the adjacent line comprises a unidirectional data line.

10. The method of claim 6, wherein the bidirectional line comprises a data line and the adjacent line comprises a unidirectional power supply line.

11. A method of repairing two adjacent shorted bidirectional lines of an organic light emitting display device, the method comprising:

cutting at least one bidirectional line to create cuts that separate a portion of the at least one bidirectional line where the short defect occurs from remaining portions of the at least one bidirectional line and such that the remaining portions of the at least one bidirectional line each function as a unidirectional line to provide power or a signal in a direction toward the cuts.

12. The method of claim 11, wherein the at least one bidirectional line is cut in an area where the at least one bidirectional line does not overlap with a lower line.

13. The method of claim 11, wherein the at least one bidirectional line is cut using a laser.

14. The method of claim 11, wherein the cutting of at least one bidirectional line comprises cutting only one of the two adjacent bidirectional lines.

15. The method of claim 11, wherein the cutting of at least one bidirectional line comprises cutting both of the two adjacent bidirectional lines.

16. The method of claim 11, wherein the two adjacent bidirectional lines of the organic light emitting display device comprise a power supply line and a data line, respectively.

17. The method of claim 16, wherein the cutting of at least one bidirectional line comprises cutting only the power supply line.

18. The method of claim 16, wherein the cutting of at least one bidirectional line comprises cutting only the data line.

19. The method of claim 16, wherein the cutting of at least one bidirectional line comprises cutting both the power supply line and the data line.

* * * * *